(12) United States Patent
Hsu

(10) Patent No.: US 6,496,051 B1
(45) Date of Patent: Dec. 17, 2002

(54) OUTPUT SENSE AMPLIFIER FOR A MULTIBIT MEMORY CELL

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/947,671

(22) Filed: Sep. 6, 2001

(51) Int. Cl.[7] .............................................. H03K 17/687
(52) U.S. Cl. ......................... 327/427; 327/374; 327/530
(58) Field of Search .............................. 327/51, 52, 54, 327/108, 427, 374, 376, 377, 530, 389, 391, 541, 543; 326/106, 108, 83, 56–58; 365/205, 185.03, 185.21, 185.18

(56) References Cited

U.S. PATENT DOCUMENTS

| | | | |
|---|---|---|---|
| 4,152,716 A | 5/1979 | Torii et al. ................... 257/368 |
| 4,298,811 A | 11/1981 | Salters et al. ................ 327/541 |
| 5,045,728 A | * 9/1991 | Crafts ........................... 326/27 |
| 5,475,331 A | * 12/1995 | Bult et al. ................... 327/427 |
| 5,621,342 A | * 4/1997 | Wong et al. ................. 327/108 |
| 6,256,247 B1 | 7/2001 | Perner ......................... 365/209 |

* cited by examiner

Primary Examiner—Terry D. Cunningham
Assistant Examiner—Long Nguyen
(74) Attorney, Agent, or Firm—Matthew D. Rabdau; David C. Ripma; Scott C. Krieger

(57) ABSTRACT

A read circuit for a multibit memory cell is provided to convert a multi-level voltage output from the multibit memory cell into the desired number of binary levels. For example, if the multibit memory cell can be programmed to have four resistance levels, which produce four output voltages respectively, the read circuit is provided with two binary outputs. For additional resistance levels, and corresponding voltage levels, additional binary outputs may be provided.

11 Claims, 3 Drawing Sheets

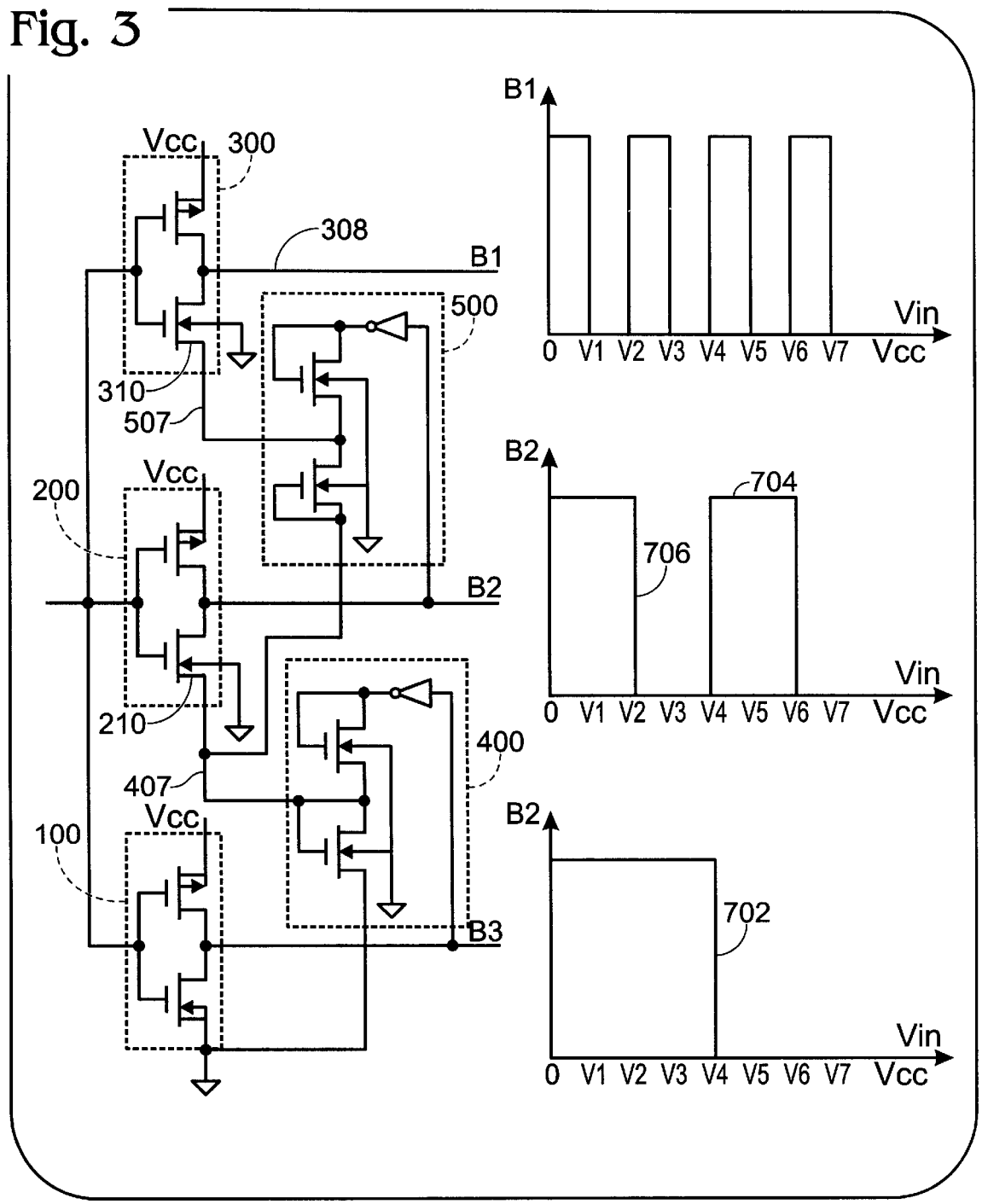

OUTPUT SENSE AMPLIFIER FOR A MULTIBIT MEMORY CELL

BACKGROUND OF THE INVENTION

The present invention relates to information storage devices, and more specifically to sense amplifiers for a resistive bit used as part of a memory device.

New materials are now making it possible to produce multibit memory cells that are able to have more then just two states. Materials having a perovskite structure, among them colossal magnetoresistance (CMR) materials and high temperature superconductivity (HTSC) materials are materials that have electrical resistance characteristics that can be changed by external influences.

For instance, the properties of materials having perovskite structures, especially for CMR and HTSC materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity from those used to induce the initial change.

The resistance of the material forming the resistive bit can vary over a range of values. Allowing a single resistive bit to support more than one equivalent binary bit worth of data. It may be possible for single resistive bit to store a value that is equivalent to several binary its.

SUMMARY OF THE INVENTION

A read circuit is provided to convert a value stored in a resistive bit into an equivalent binary output. The read circuit comprises a voltage input from the resistive bit connected to a first bit-sensing and a second bit-sensing amplifier. The first bit-sensing amplifier comprises a input node connected to the voltage input, a first output bitline and a first source. The second bit-sensing amplifier comprises an input node connected to the voltage input, a second output bitline and a second source. The first output bitline is connected to an inverter that has an output connected to a voltage divider. The voltage divider comprises FETs in series between the inverter output and a level adjustment input, which corresponds to a FET source, which is connected to the first source. The voltage divider further comprises a divider output connected to the second source. The connection from the voltage divider to the second source provides an offset allowing the second bit-sensing amplifier to reset its binary output when the input voltage is higher than an initial switching voltage of the second bit-sensing amplifier.

BRIEF DESCRIPTION OF THE DRAWINGS

FIG. 3 shows a schematic view of a 3-bit read circuit with corresponding output waveforms.

DETAILED DESCRIPTION OF THE INVENTION

Figure 1:
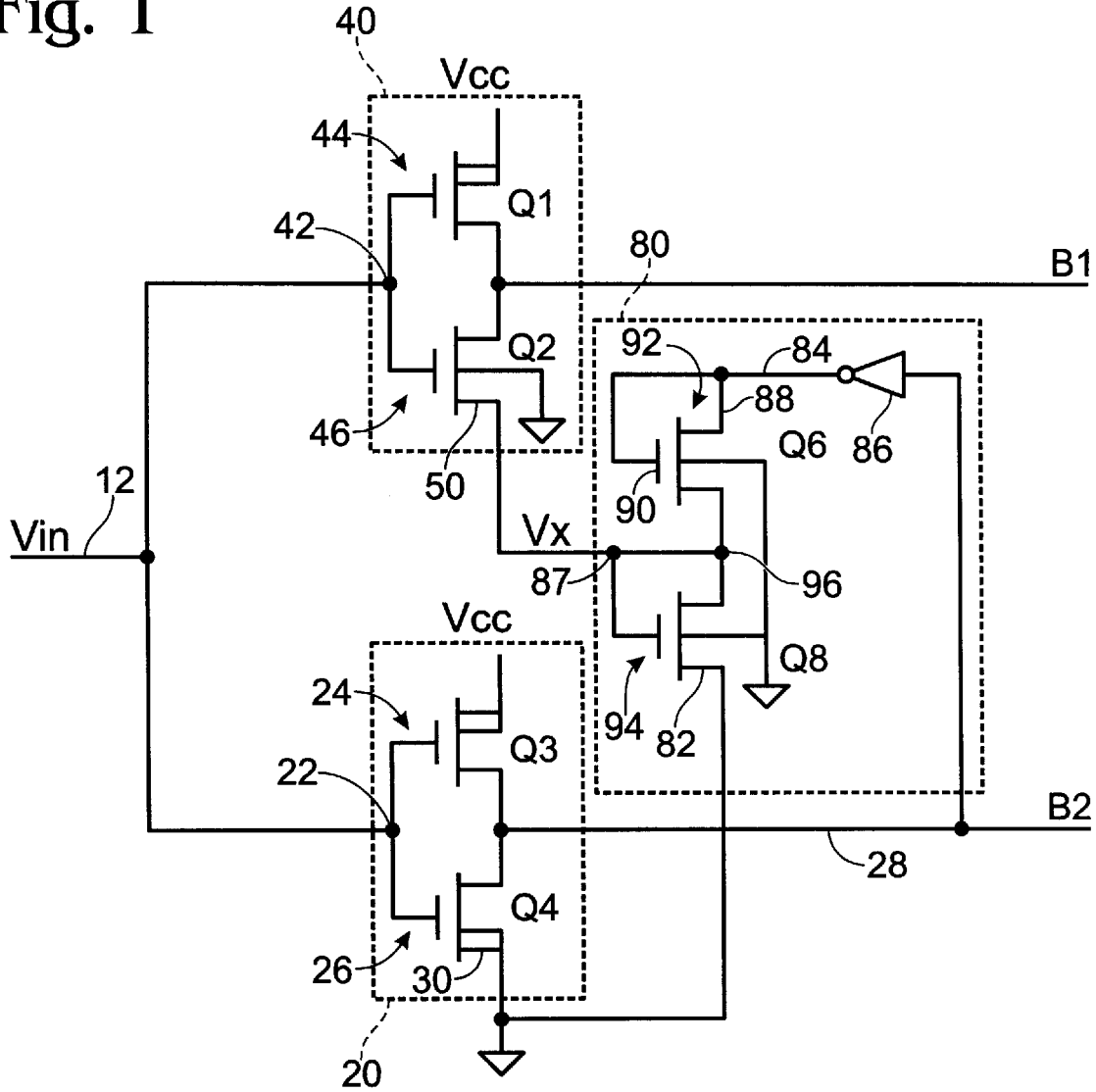
FIG. 1 is a schematic view of a 2-bit read circuit.

FIG. 1 shows an illustrative example of a read circuit 10 for converting voltage from a multibit memory cell having four voltage levels into a 2-bit binary output.

The read circuit 10 is shown having two output bits, B1 and B2. Two output bits allow the read circuit 10 to convert up to 4 resistance levels of a multibit memory cell into a binary number from 00 to 11. The read circuit 10 is shown having two bit-sensing amplifiers, and a voltage divider circuit.

An input voltage (Vin) 12 is connected from a multibit memory cell, which is not shown, to a first input node 22 of a first bit-sensing amplifier 20, and a second input node 42 of a second bit-sensing amplifier 40.

The first bit-sensing amplifier 20 comprises a PMOS transistor (Q3) 24 connected in series to an NMOS transistor (Q4) 26 at a first output bitline 28, also noted as B2. The PMOS transistor 24 and the NMOS transistor 26 are shown connected in series between Vcc and ground. The NMOS transistor 26 has a source 30 that is shown connected to ground. Although other switchpoints may be used, this first bit-sensing amplifier 20 preferably switches when the input voltage 12 is approximately one half of Vcc.

The second bit-sensing amplifier 40 comprises a PMOS transistor (Q1) 44 connected in series to an NMOS transistor (Q2) 46 at a second output bitline 48, also noted as B1. As shown, the source of the PMOS transistor 44 is connected to Vcc. The NMOS transistor also has a source 50. Although other switchpoints may be used, this second bit-sensing amplifier 40 preferably switches when the voltage difference between the input voltage 12 and the source 50 is approximately one forth of Vcc.

A voltage divider circuit 80 comprises a pair of transistors, Q6 and Q8. As shown the transistors are both n-type, however a voltage divider circuit for use in connection with the present invention could be constructed using p-type transistors instead. The voltage divider circuit 80 comprises a level adjustment input 82, which may correspond to a source of a divider transistor, connected to the source 30, a bit input 84 connected to the first output bitline 28 through an inverter 86, and first divider output 87, which is also marked as Vx, connected to the source 50 of the second bit-sensing amplifier 40. The bit input 84 is connected to a drain 88 and a gate 90 of transistor 92, such that the drain and the gate are shorted together. The first divider output 87 is connected to a gate 94 and a connection point 96 between the pair of transistors. The output voltage at the first divider output 87 is preferably about one half of the voltage at the bit input 84. Although, one half of the voltage at the bit input 84 is preferred, other voltage levels may be desirable and are within the scope of the claims. The pair of transistors Q6 and Q8 set the triggering voltage for the binary "10" and binary "11" bit.

The current flow through Q1 is equal to the current flow through Q2 at V1 and V3, respectively, when B1 switches. Therefore, where Vx is the Q8 drain voltage at the switch point, and assuming the MOS drain current follows the square rules, the following equations illustrate the switching relationships.

$$K_N(V1-V_{TN})^2 = K_P(V_{CC}V1-V_{TP})^2 \quad (1)$$

$$K_N(V3-V_X-V_{TN})^2 = K_P(V_{CC}-V3-V_{TP})^2 \quad (2)$$

From (1) and (2) it is possible to obtain:

$$V_X = \frac{(V_{CC} - V_{TN} - V_{TP})(V3 - V1)}{V_{CC} - V1 - V_{TP}} \quad (3)$$

Since the resistance of a transistor is a function of its W/L ratio, it also evident that the amount of voltage division desired can be adjusted by properly adjusting the W/L ratio of the transistors with respect to each other:

$$\frac{W_6/L_6}{W_8/L_8} = \frac{V_X}{V_{CC} - V_X} \qquad (4)$$

$$= \frac{(V_{CC} - V_{TN} - V_{TP})(V3 - V1)}{V_{CC}(V_{CC} - V_{TP} - V3) + V3(V_{TN} + V_{TP})}$$

Therefore, by designing the transistors of the first divider, Q6 and Q8, a precision switching voltage control can be obtained. It is possible to make the length of the transistors the same and adjust only the width so that the voltage division is a function of $W_6/W_8$. Although the transistors of the voltage divider circuit are shown as n-channel transistors, the voltage divider circuit could also be made using p-channel transistors.

The digital output of the read circuit is output as 00, 01, 10, 11, when an input voltage from a multibit memory cell is between 0 and V1, V1 and V2, V2 and V3, V3 and V4, respectively. The voltage V1 should be larger than the threshold voltage ($V_{TN}$) of an n-channel transistor. V1, V2, V3 and Vcc need not be evenly divided. The following voltage relationships should be maintained: Vcc=V4>V3>V2>V1>$V_{TN}$ and V4–V3>-$V_{TP}$. Table 1. shows the relationship between a voltage input Vin and the converted binary output.

TABLE 1

| Vin | 0–V1 | V1–V2 | V2–V3 | V3–V4 |
| --- | --- | --- | --- | --- |
| B1 | 0 | 1 | 0 | 1 |
| B2 | 0 | 0 | 1 | 1 |
| Binary | 00 | 01 | 10 | 11 |

The same general principal may be applied to additional bits. For example, a 3-bit memory cell capable of converting 8 input voltage levels into a binary number from 000 to 111 may be produced by adding an additional sensing amplifier and an additional voltage divider circuit. In this case, the following voltage conditions should be present Vcc=V8>V7>V6>V5>V4>V3>V2>V1>$V_{TN}$ and V8–V7>-$V_{TP}$. The voltage need not be evenly divided. The size of the voltage divider transistors could be adjusted for optimum operation.

Figure 2:
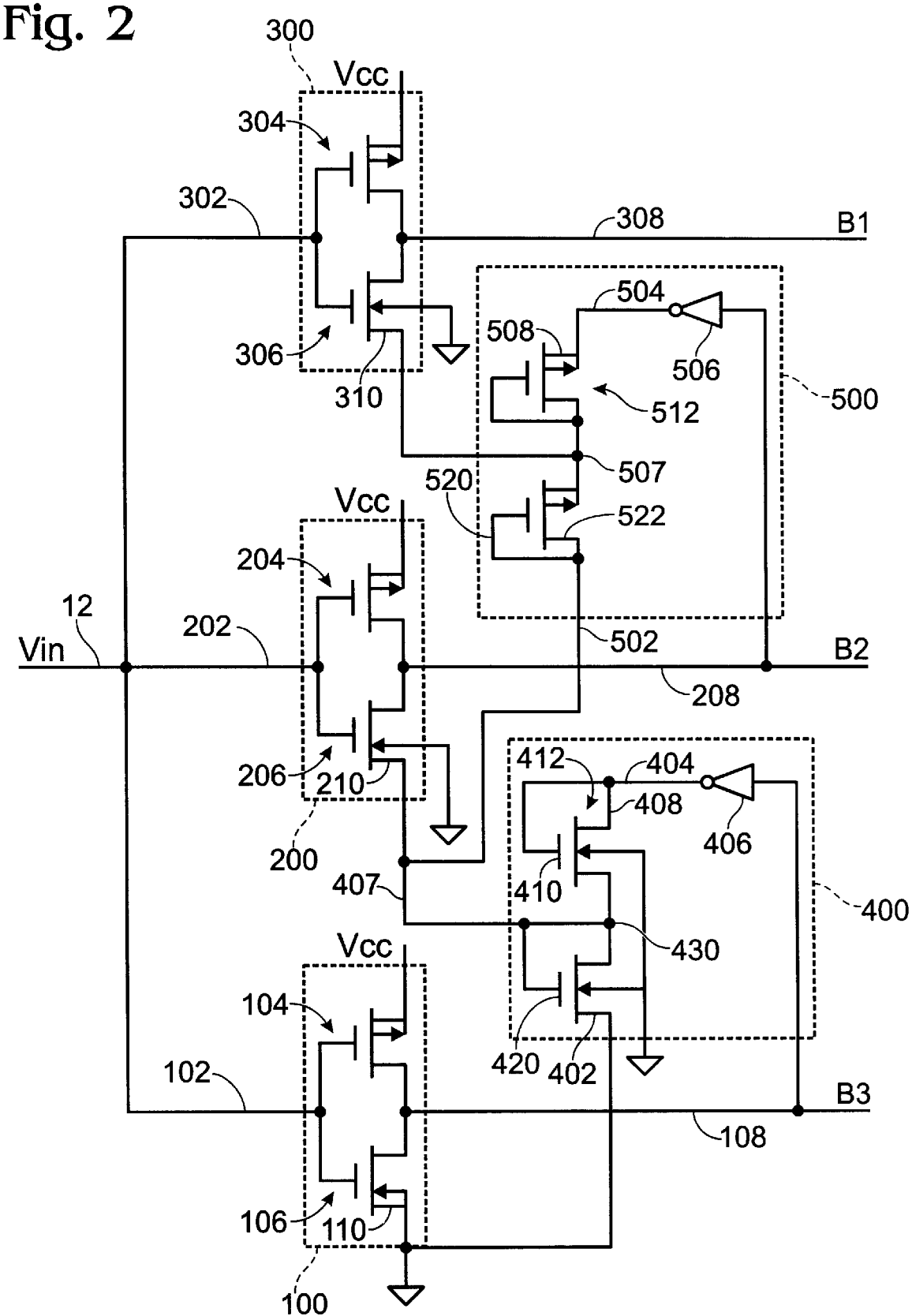
FIG. 2 is a schematic view of a 3-bit read circuit.

Referring now to FIG. 2, the read circuit 10 is shown having a three output bits. The read circuit 10 is shown having three bit-sensing amplifiers, and two voltage divider circuits. Following an explanation of the read circuit of FIG. 1, it should be clear that additional bits could be provided by adding an additional bit-sensing amplifier and an additional voltage divider circuit for each additional bit.

An input voltage (Vin) 12 is connected from a multibit memory cell, which is not shown, to a first input node 102 of a first bit-sensing amplifier 100, a second input node 202 of a second bit-sensing amplifier 200, and a third input node 302 of a third bit-sensing amplifier 300.

The first bit-sensing amplifier 100 comprises a PMOS transistor 104 connected in series to an NMOS transistor 106 at a first output bitline 108, also indicated as B3. The PMOS transistor 104 and the NMOS transistor 106 are shown connected in series between Vcc and ground. The NMOS transistor 106 has a source 110 that is shown connected to ground. Although other switchpoints may be used, this first bit-sensing amplifier 100 preferably switches when the input voltage 12 is approximately one half of Vcc.

The second bit-sensing amplifier 200 comprises a PMOS transistor 204 connected in series to an NMOS transistor 206 at a second output bitline 208, also indicated as B2. As shown, the source of the PMOS transistor 204 is connected to Vcc. The NMOS transistor also has a source 210. Although other switchpoints may be used, this second bit-sensing amplifier 200 preferably switches when the voltage difference between the input voltage 12 and the source 210 is approximately one forth of Vcc.

A first voltage divider circuit 400 comprises a pair of transistors. As shown the transistors are both n-type, however a voltage divider circuit for use in connection with the present invention could be constructed using p-type transistors instead as will be discussed below. The voltage divider circuit comprises a first level adjustment input 402, which may correspond to a divider transistor source, connected to the source 110, a bit input 404 connected to the first output bitline 108 through an inverter 406 and first divider output 407 connected to the source 210 of the second bit-sensing amplifier 200. The bit input 404 is connected to a drain 408 and a gate 410 of transistor 412, such that the drain and the gate are shorted together. The first divider output 407 is connected to a gate 420 and a connection point 430 between the pair of transistors. Although other divider ratios may be used, the voltage at the first divider output 407 is preferably about one half of the voltage at the bit input 404.

The third bit-sensing amplifier 300 comprises a PMOS transistor 304 connected in series to an NMOS transistor 306 at a third output bitline 308, also indicated as B1. As shown, the source of the PMOS transistor 304 is connected to Vcc. The NMOS transistor also has a source 310. Although other switchpoints may be used, this third bit-sensing amplifier 300 preferably switches when the voltage difference between the input voltage 12 and the source 310 is approximately one eighth of Vcc.

A second voltage divider circuit 500 comprises a pair of transistors. As shown the transistors are both p-type, however a voltage divider circuit for use in connection with the present invention could be constructed using n-type transistors instead, as discussed above. The voltage divider circuit comprises a second level adjustment input 502, which may correspond to a source of a divider transistor, connected to the source 210, a bit input 504 connected to the second output bitline 208 through an inverter 506 and second divider output 507 connected to the source 310 of the third bit-sensing amplifier 300. The bit input 504 is connected to a source 508 of transistor 512. The second level adjust input 502 is connected to a gate 520, as well as a drain 522. Although other divider ratios may be used, the voltage at the second divider output 507 is preferably about one forth of the voltage difference between the voltage at the bit input 504 and the source 502.

For purposes of illustration, the read circuit 10 in FIG. 2 is shown having an n-type divider circuit 400 and a p-type divider circuit 500. It is entirely possible to utilize all n-type dividers, all p-type dividers or any desired combination of n-type dividers and p-type dividers.

Referring now to FIG. 3, which illustrates a read out circuit with accompanying output wave forms. Note that high output voltages correspond to binary "0" in the waveforms as shown. The first voltage divider circuit 400 and the second voltage divider circuit 500 are both shown as using n-type transistors. Once the voltage level is high enough so that the first bit sensing amplifier output B3 switches, as shown at 702, the first divider output 407 provides a sufficient offset at the source 210 of the second bit sensing amplifier 200 so that the second bit sensing amplifier can turn return to a high voltage output, as shown at 704. If the source 210 were connected simply to ground, once a sufficient voltage, such as V2, is reached the second output bitline 208 would drop, as shown at 706, and remain low as higher voltages were applied. The presence of the offset allows the second output bitline 208 to return to a high output value, as shown at 704. The combined effects of all of the preceding offsets, in this case from the first divider output 407 offsetting the second divider output 507, allows the third output bitline (BI) 308 to switch as indicated. In the case of additional bits, the effects of the additional divider circuits will further contribute to the offsets. In actual implementation, the switchpoints may not always line up. The divider circuits and the design of the input sensing amplifiers may be optimized to approximate evenly spaced switch points. Also, as the switch points are essentially bands in a range between two voltage points, it is possible to design the memory device such that the voltage levels of the resistive bit are located at the desired position within a given voltage band.

Although illustrative embodiments have been discussed above, the coverage is not limited to these specific embodiments. For example, additional sensing amplifiers and dividers may be added to provide additional bits. It should also be clear that although the transistor discussed above have been referred to as MOS type devices other suitable transistors could be used, including transistors that do not utilize an oxide as the gate insulator. For example, any suitable FET transistors could be used. Rather, the claims shall determine the scope of the invention.

What is claimed is:

1. A read circuit for a multibit memory cell, the read circuit comprising:
   a) a voltage input;
   b) a first bit-sensing amplifier comprising a first input node connected to the voltage input, a first output bitline, and a first source;
   c) a second bit-sensing amplifier comprising a second input node connected to the voltage input, a second output bitline, and a second source; and
   d) a voltage divider circuit comprising a level adjustment input connected to the first source, a bit input connected through an inverter to the first output bitline, and a divider output connected to the second source.

2. The read circuit of claim 1, wherein the first bit-sensing amplifier is a CMOS inverter.

3. The read circuit of claim 1, wherein the second bit-sensing amplifier is a CMOS inverter.

4. The read circuit of claim 1, wherein the voltage divider circuit is an NMOS voltage divider.

5. The read circuit of claim 1, wherein the voltage divider is a PMOS voltage divider.

6. The read circuit of claim 1, wherein the first output bitline corresponds to the highest level bit, and the second output bitline corresponds to a lower level bit.

7. The read circuit of claim 1, wherein the first source is connected to ground.

8. A read circuit for a multibit memory cell comprising:
   a) a voltage input connected from the multibit memory cell to a first CMOS inverter, such that the voltage input is connected to a first gate of a first PMOS transistor and a second gate of a first NMOS transistor, wherein the first CMOS inverter comprises the first PMOS transistor comprising a first source connected to Vcc and a first drain connected to a first bitline output, the first NMOS transistor comprising a second drain connected to the first bitline output and a second source connected to ground;
   b) a first divider circuit comprising a first level adjust input connected to the second source, a first bit input connected to the first bitline output through a first inverter, and a first offset output; and
   c) wherein the voltage input is also connected from the multibit memory cell to a second CMOS inverter, such that the voltage input is connected to a third gate of a second PMOS transistor and a fourth gate of an second NMOS transistor, wherein the second CMOS inverter comprises the second PMOS transistor comprising a third source connected to Vcc and a third drain connected to a second bitline output, the second NMOS transistor comprising a fourth drain connected to the second bitline output and a forth source connected to the first offset output.

9. The read circuit of claim 8, further comprising:
   a) a second divider circuit comprising a second level adjust input connected to the fourth source, a second bit input connected to the second bitline output through a second inverter, and a second offset output; and
   b) wherein the voltage input is also connected from the multibit memory cell to a third CMOS inverter, such that the voltage input is connected to a fifth gate of a third PMOS transistor and a sixth gate of a third NMOS transistor, wherein the third CMOS inverter comprises the third PMOS transistor comprising a fifth source connected to Vcc and a fifth drain connected to a third bitline output, the third NMOS transistor comprising a sixth drain connected to the third bitline output and a sixth source connected to the second offset output.

10. The read circuit of claim 8, wherein the first divider circuit comprises series connected FETs, each FET having a FET gate and a FET drain shorted together, such that the first offset output is derived from a connection point between FETs.

11. A read circuit for a multibit memory cell comprising:
   a) a first means for sensing an input voltage from the multibit memory cell and providing a first output voltage;
   b) a second means for sensing a voltage difference between the input voltage from the multibit memory cell and an offset voltage, and providing a second output voltage; and
   c) a means for providing the offset voltage based upon the first output voltage.

* * * * *